United States Patent
Matsuzawa et al.

(10) Patent No.: US 7,649,737 B2
(45) Date of Patent: Jan. 19, 2010

(54) FLAT PANEL DISPLAY

(75) Inventors: Toshihiko Matsuzawa, Kamakura (JP); Mitsuo Okimoto, Chigasaki (JP); Sadayuki Nishimura, Yokohama (JP); Yoshie Kodera, Chigasaki (JP); Nobuo Masuoka, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 334 days.

(21) Appl. No.: 11/723,207

(22) Filed: Mar. 16, 2007

(65) Prior Publication Data
US 2007/0258017 A1   Nov. 8, 2007

(30) Foreign Application Priority Data
Mar. 17, 2006   (JP) .............................. 2006-073727

(51) Int. Cl.
*H05K 7/20*   (2006.01)
(52) U.S. Cl. ......................... 361/679.54; 361/679.46; 361/679.47; 361/688; 361/704; 174/252
(58) Field of Classification Search ............ 361/679.54; 349/1
See application file for complete search history.

(56) References Cited

U.S. PATENT DOCUMENTS

| | | | | |
|---|---|---|---|---|
| 5,550,326 A * | 8/1996 | Kesel | ......................... | 174/16.3 |
| 5,766,740 A * | 6/1998 | Olson | ......................... | 428/209 |
| 5,912,805 A * | 6/1999 | Freuler et al. | ............... | 361/705 |
| 7,297,399 B2 * | 11/2007 | Zhang et al. | ................ | 428/339 |
| 7,323,808 B2 * | 1/2008 | Kim et al. | ...................... | 313/44 |
| 7,508,673 B2 * | 3/2009 | Kim et al. | .................... | 361/704 |
| 2004/0042171 A1 * | 3/2004 | Takamatsu et al. | .......... | 361/687 |
| 2005/0264982 A1 | 12/2005 | Kim et al. | | |
| 2005/0270436 A1 * | 12/2005 | Miyamura et al. | ............ | 349/58 |
| 2006/0077635 A1 * | 4/2006 | Kim et al. | ................... | 361/688 |
| 2006/0098412 A1 * | 5/2006 | Kim et al. | ................... | 361/704 |
| 2006/0126299 A1 * | 6/2006 | Park | .......................... | 361/702 |
| 2006/0158845 A1 * | 7/2006 | Kim | ............................ | 361/687 |
| 2008/0117575 A1 * | 5/2008 | Kang | ......................... | 361/681 |
| 2008/0151502 A1 * | 6/2008 | Shives et al. | ................ | 361/704 |

FOREIGN PATENT DOCUMENTS

| | | |
|---|---|---|
| JP | 2004-258473 A | 9/2004 |
| JP | 2004-333904 A | 11/2004 |
| JP | 2005-331948 A | 12/2005 |

* cited by examiner

*Primary Examiner*—Jayprakash N Gandhi
*Assistant Examiner*—Anthony Q Edwards
(74) *Attorney, Agent, or Firm*—McDermott Will & Emery LLP

(57) ABSTRACT

The invention provides a technique enabling an image of high quality to be displayed while decreasing an effect of an outside light proceeding toward a back surface of PDP through a through hole for mounting an electric circuit on a chassis. A flat panel display of the invention includes a display panel, a metallic chassis having a through hole and joints for connecting the back surface of the display panel and the chassis to each other. The joints are on the back surface of the display panel distant from each other in a predetermined direction, and one of the joints is arranged at a position corresponding to the through hole of the chassis.

17 Claims, 7 Drawing Sheets

FLAT PANEL DISPLAY

INCORPORATION BY REFERENCE

The present application claims priority from Japanese application JP 2006-073727 filed on Mar. 17, 2006, the content of which is hereby incorporated by reference into this application.

BACKGROUND OF THE INVENTION

The present invention relates to a display having a flat display panel.

In a flat panel display, particularly a display having a self-luminous type panel such as a plasma display panel (hereafter, called as PDP) or the like, an ingenuity for discharging a heat energy of the panel is performed. For example, JP-A-2004-333904 discloses that a back surface of PDP and a metallic (aluminum) chassis member are joined with a plurality of regions of thermally conductive adhesive shaped as lines to transmit through the adhesive to the chassis member the heat energy generated by the PDP to be discharged.

An electric circuit substrate for driving the PDP is attached to the chassis member through a boss member of the like. Occasionally, the chassis member has a plurality of through holes to which the boss member is mounted with a screw to be attached to the electric circuit substrate (for example, refer to JP-A-2004-258473). Further, in another case, a part of the chassis member is removed to form monolithically the boss member, and the electric circuit substrate is attached to the boss member (for example, refer to JP-A-2005-331948).

BRIEF SUMMARY OF THE INVENTION

According to JP-A-2004-258473, the chassis member has a plurality of the through holes corresponding to and used selectively for respective kinds of the electric circuit substrate so that the chassis member includes unused one of the through holes. Further, according to JP-A-2004-333904, the part of the chassis is removed to form the boss member so that corresponding one of the through holes is formed on the chassis member.

Further, as shown in FIG. 1 of JP-A-2004-258473 and FIG. 1 of JP-A-2005-331948, a rear cover covering a back surface of apparatus has plenty of ambient air inlets and exhaust holes for discharging the heat energy generated by the PDP and the electric circuit substrate so that a light proceeds into the inside of apparatus from the outside thereof.

In JP-A-2004-333904 in which the regions of adhesives for joining the PDP and the chassis member are arranged separately from each other and the chassis has the through holes, there is a probability of that the outside light reaches directly from the ambient air inlets and exhaust holes through the through holes the other regions of the back surface of PDP on which the adhesive is not arranged. The outside light reaching the back surface of PDP causes an undesired increase of brightness on a part of a display screen of PDP so that so called intensity unevenness on the display screen occurs. In the above prior art, an influence of the outside light reaching the back surface of PDP is not considered.

According to the invention, a technique for decreasing the influence of the outside light reaching the back surface of the display panel to obtain a screen image of high quality is provided.

In the invention, the back surface of the display panel and the chassis member are joined with a plurality of joints distant from each other in a predetermined direction. Further, the joints are arranged at positions corresponding to the through holes formed on the chassis member.

The joints have thermal conductivity and transmission coefficient not more than 20% for visible light. Further, the joints have preferably rectangular shapes forming a predetermined interval in a direction along a long side of the screen of the display panel and extending in a direction along a short side of the screen of the display panel. Further, the joints may be of an adhesive of hot melting type having adhesion at normal temperatures.

According to such structure, since the joints cover the through holes of the chassis, the outside light proceeding from the through holes of the chassis is attenuated or blocked. Therefore, the outside light is prevented from reaching directly the back surface of the display panel, so that the influence on the display screen caused by the outside light is decreased.

According to the invention, the influence of the outside light reaching the back surface of the display panel is decreased to enable a screen image of high quality to be displayed.

Other objects, features and advantages of the invention will become apparent from the following description of the embodiments of the invention taken in conjunction with the accompanying drawings.

Figure 2A:
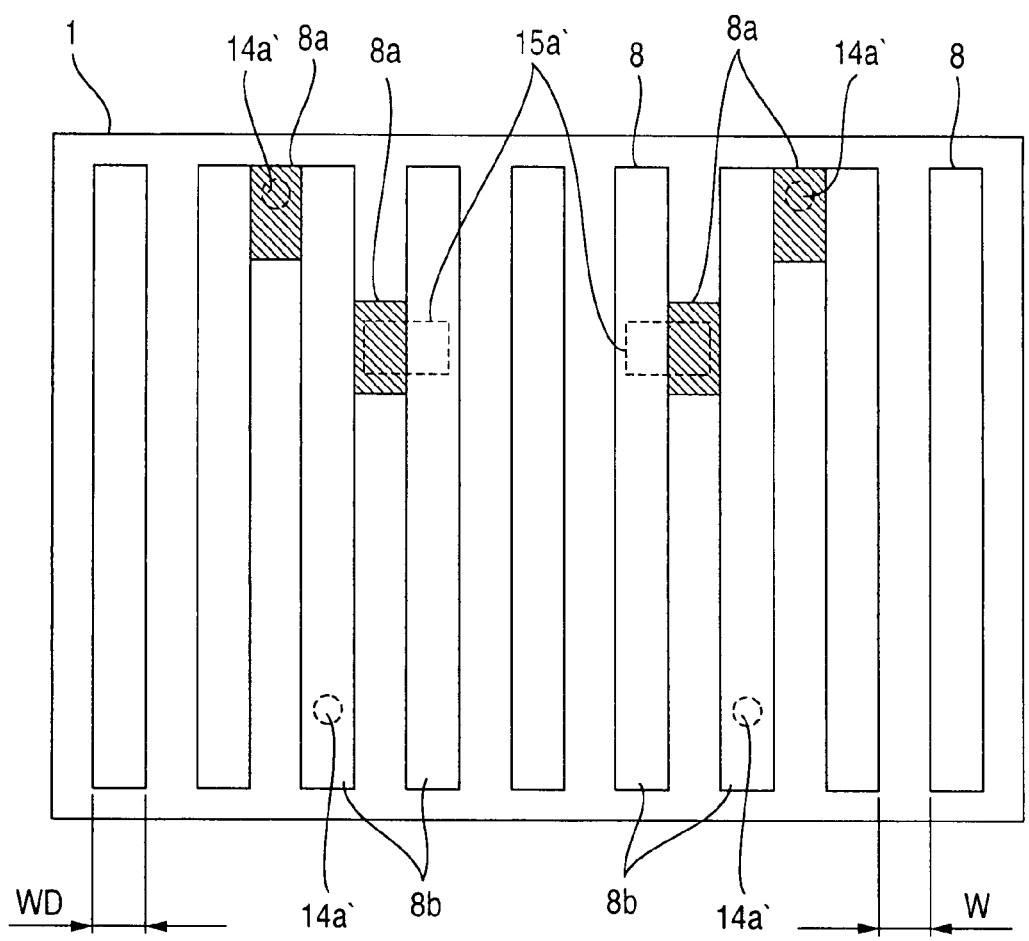
Figure 2B:
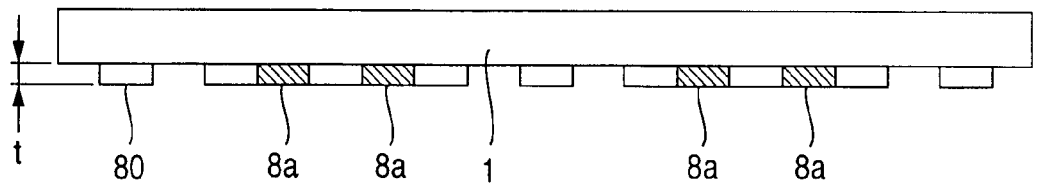

Each of FIGS. 2a and 2b is a view showing adhesive members of stripe shape applied onto a back surface of PDP of the first embodiment of the invention.

Figure 3:
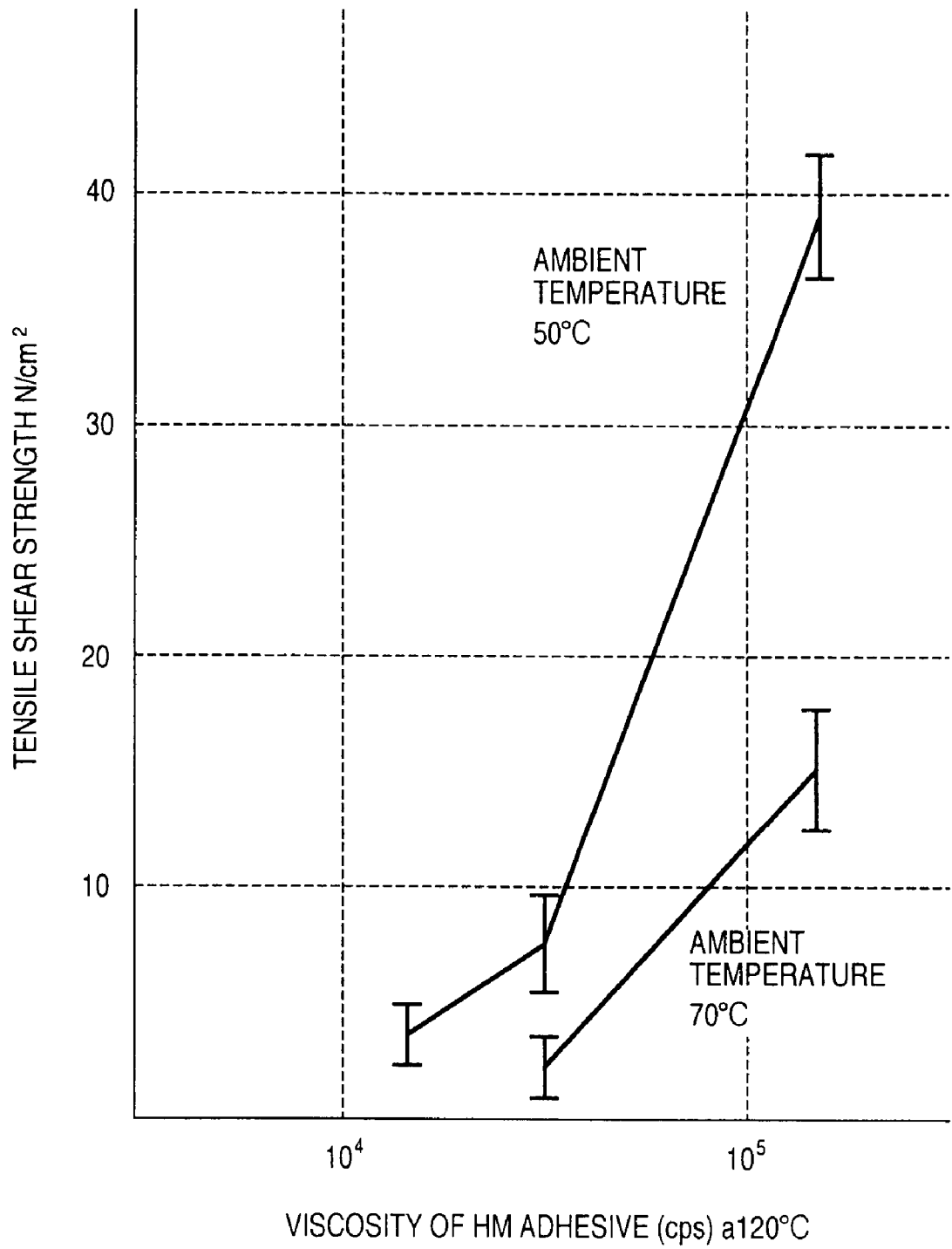

FIG. 3 is a view showing a relationship between a tensile shear strength and a viscosity of HM adhesive members.

Figure 4:
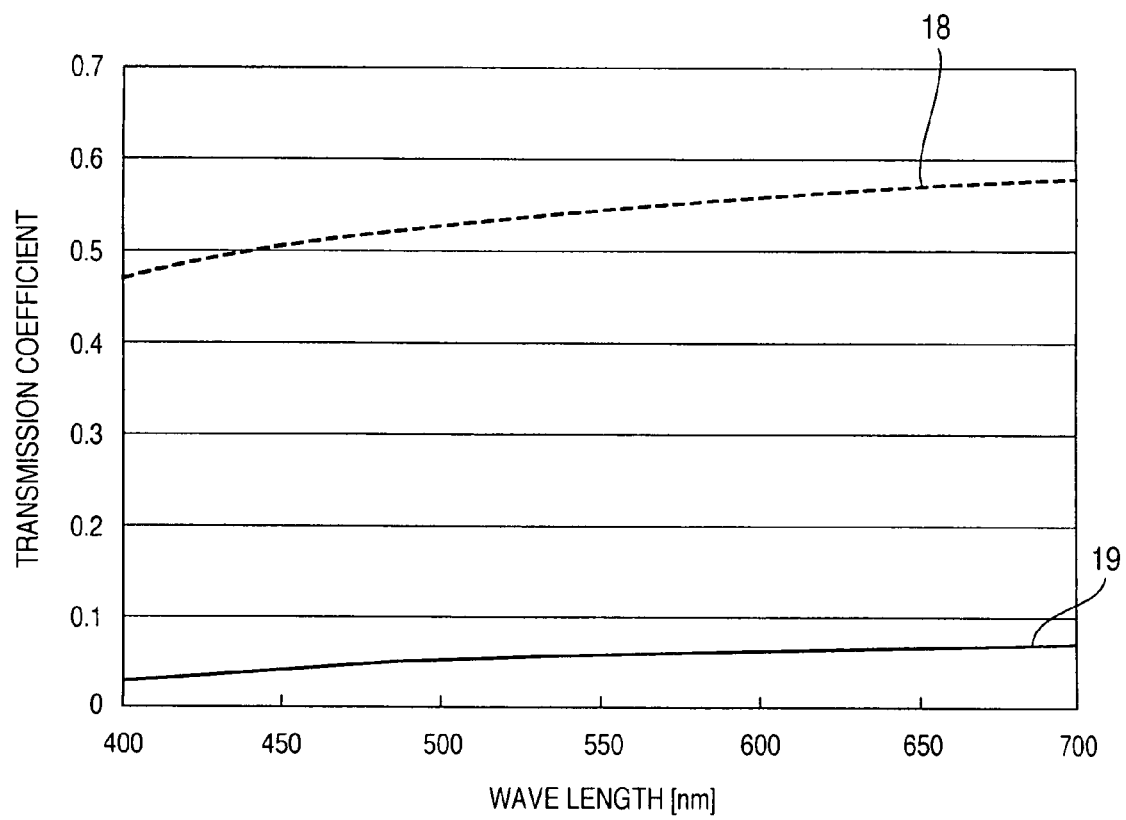

FIG. 4 is a result of measuring a transmission coefficient of the HM adhesive members for visible light.

Figure 5:
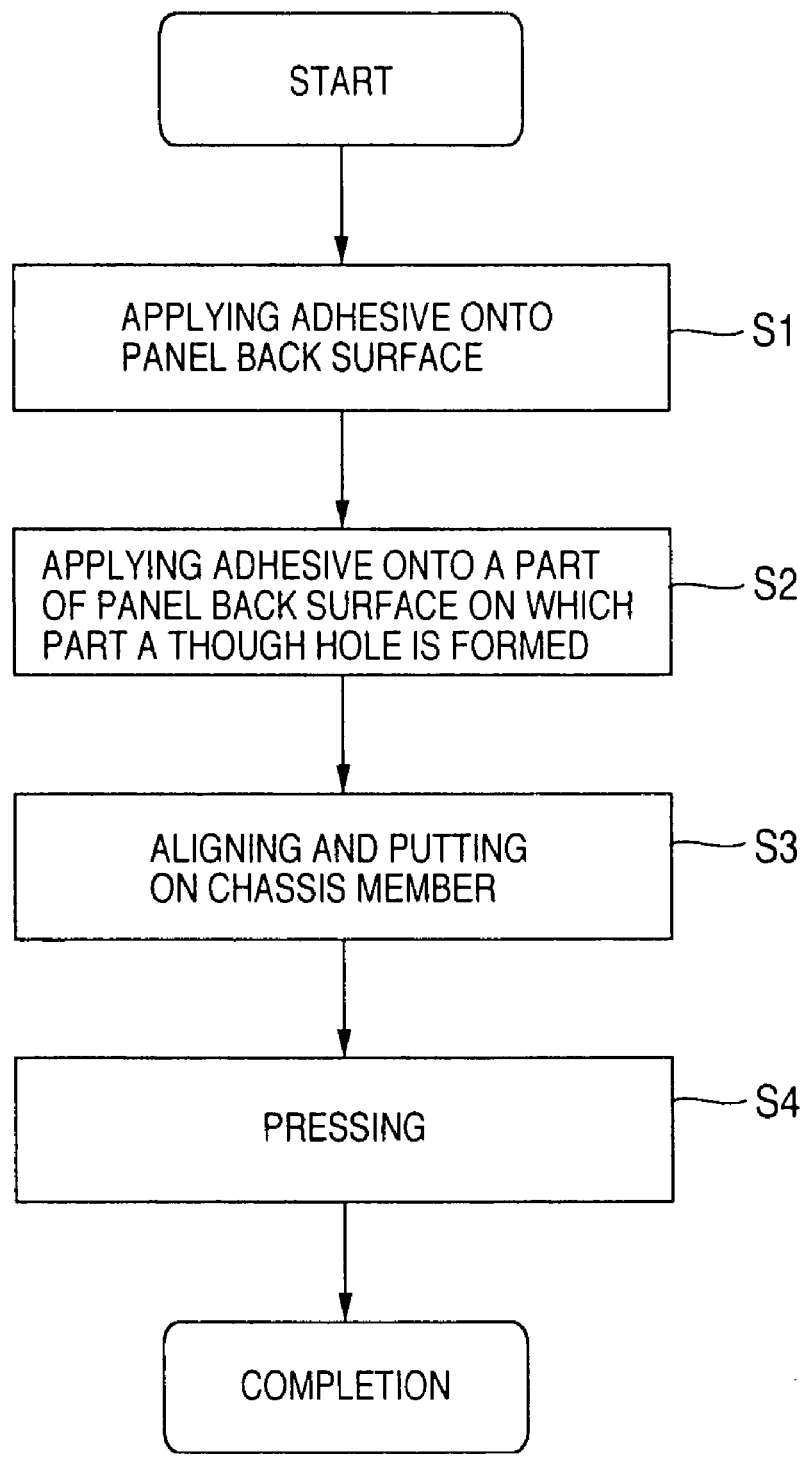

FIG. 5 is a flow chart of adhering process in the embodiment.

Figure 6:
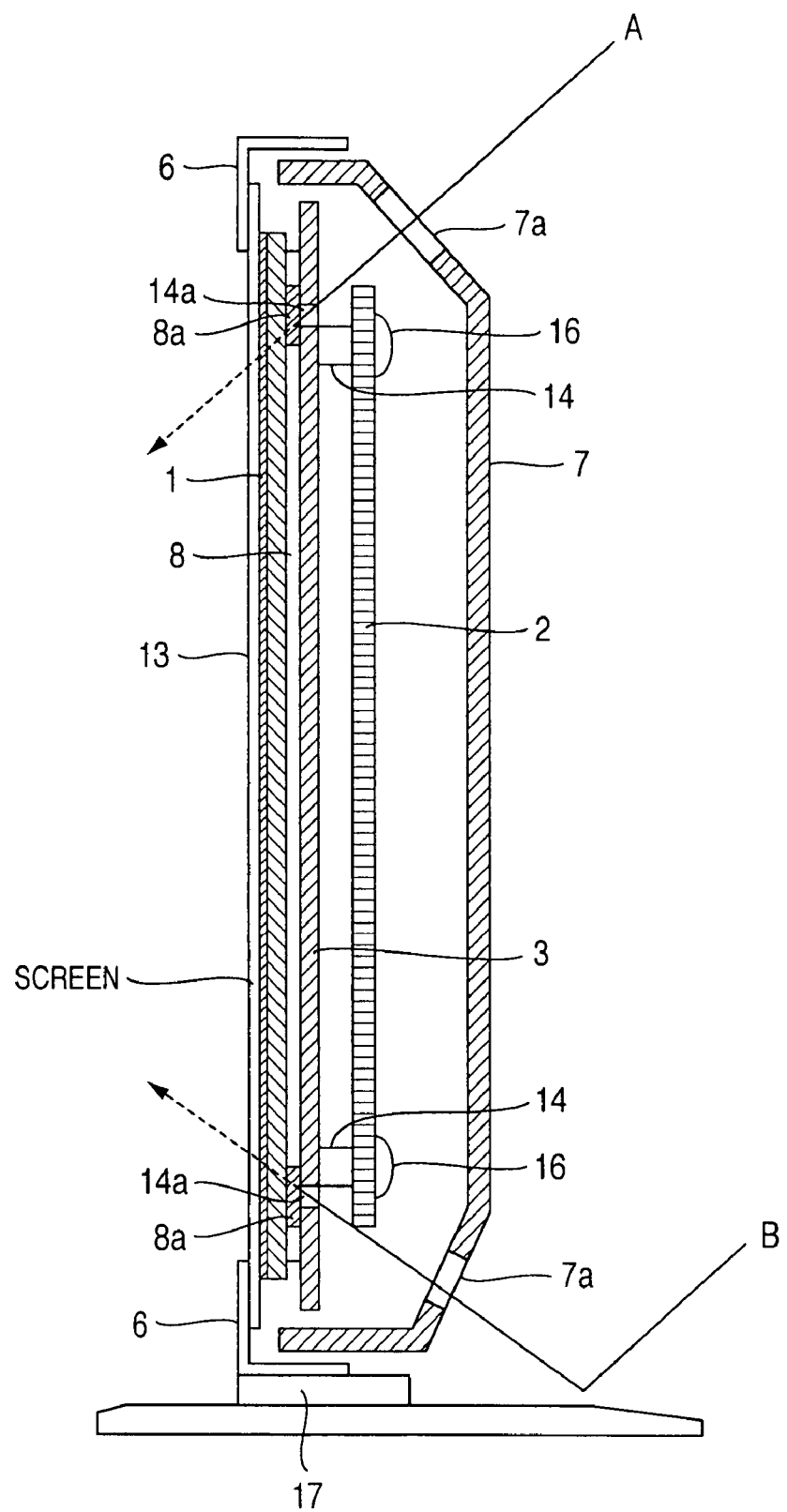

FIG. 6 is a cross sectional view of the plasma display device as the first embodiment of the invention.

Figure 7A:
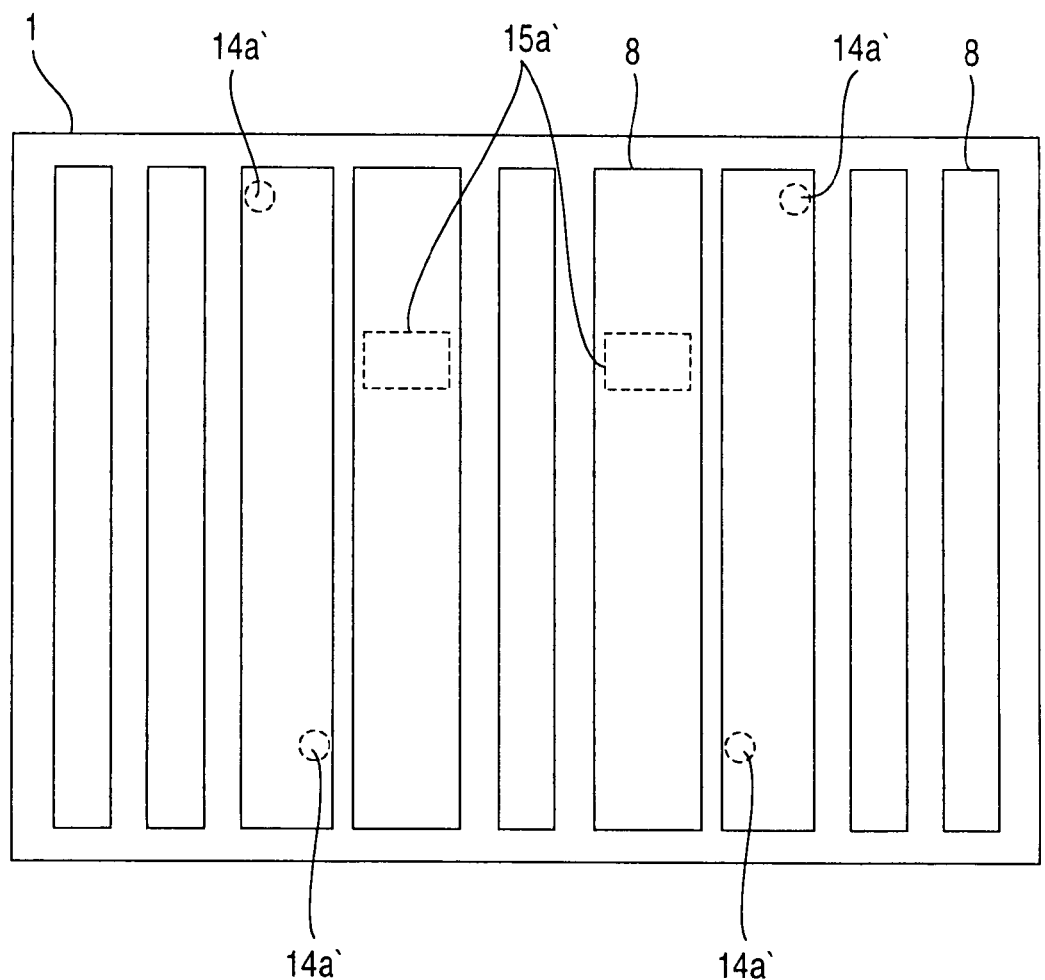
Figure 7B:
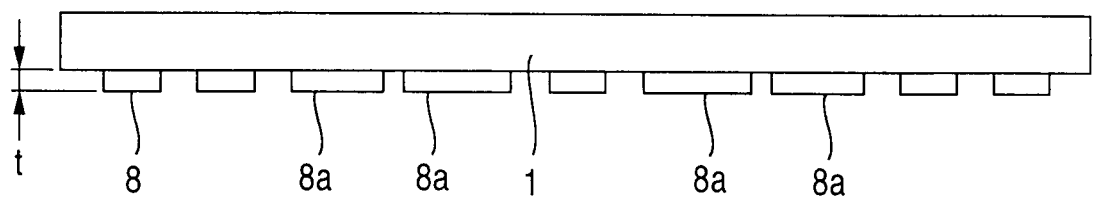

Each of FIGS. 7a and 7b is a view showing the adhesive members applied on the back surface of PDP as a second embodiment of the invention as seen from the adhesive members.

DETAILED DESCRIPTION OF THE INVENTION

Hereafter, embodiments of the invention are explained in detail with making reference to the drawings. Incidentally, a display including PDP as a flat display panel is explained as the embodiments. However, the invention does not need to be restricted therein. For example, a display panel of electron emitting element type, an organic electroluminescence panel, an LED display panel including LED elements arranged along two dimensional face or the like is usable for the display device. Further, a common reference mark denotes an element of common function, and a repeated explanation regarding the element is prevented.

In the embodiment, as joints for joining the display panel and the metallic chassis member with thermal conductivity, a hot melt type adhesive (hereafter, called as HM adhesive) having adhesion at normal temperatures (about 15-25° C., particularly 25° C. as room temperature) is used. The HM adhesive is a solid thermoplastic resin or thermoplastic rubber melted by heating to be applied to a member to be adhered. It keeps the adhesion when being cooled to the room temperature so that it is usable as so called double-stick tape. Further, the HM adhesive can adhere to the member to be adhered in a short time period (some seconds) without solvent, an applying-adhesion process is shortened. Therefore, it is preferable for decreasing a cost that the HM adhesive is used as the thermally conductive member.

First Embodiment

Figure 1:
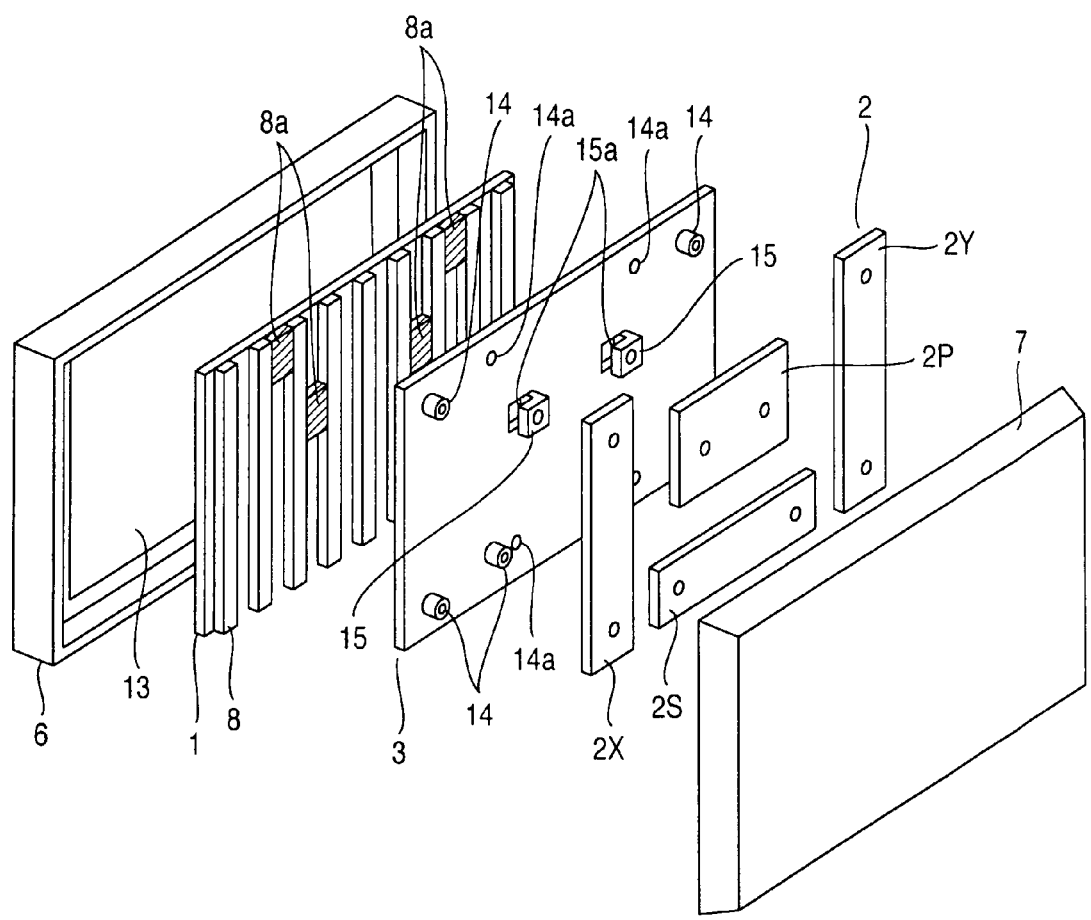
FIG. 1 is an oblique projection exploded view showing a substantial part of a plasma display device as a first embodiment of the invention.

FIG. 1 is an oblique projection exploded view showing a substantial part of a plasma display device as a first embodiment of the invention.

In FIG. 1, a casing containing a PDP 1 has a front frame 6 whose opening is covered by a front cover 13 of glass or the like, and a metallic rear cover 7. The PDP 1 is held on a front surface of a chassis member 3 made of, for example, aluminum or the like, through joints (adhesive) 8. Electric circuit substrates 2 for driving the PDF for display are mounted on a rear side of the chassis member 3. The joints 8 have thermal conductivity and are arranged to form a stripe shape substantially parallel to a short side of the PDP. The joints 8 transmit the thermal energy generated by the PDP to the chassis member 3 to be discharged. That is, the chassis member 3 has a function of discharging the thermal energy generated by the PDP to cool the PDP as well as a function as a holder member for holding the PDP 1. The discharged thermal energy is discharged to the outside of the casing by, for example, a fan not shown. Therefore, the PDP is cooled effectively. The electric circuit substrates 2 include an X sustaining substrate 2X for driving and controlling the PDF for display, a Y sustaining substrate 2Y, an electric power source substrate 2P, a signal processing substrate 2S and so forth. The electric circuit substrates 2 are electrically connected to electrode extensions extending to an end of the PDP 1 through a plurality of flexible interconnection substrates (not shown) extending over four side edges of the chassis member 3.

Next, a structure for mounting the electric circuit substrate 2 on the chassis member 3 is explained. The X sustaining substrate 2X, the Y sustaining substrate 2Y and the signal processing substrate 2S has respective mounting through holes, and the chassis member 3 has caulking through holes 14a at respective positions corresponding to the through holes of the X sustaining substrate 2X, the Y sustaining substrate 2Y and the signal processing substrate 2S. Boss members 14 of, for example, brass are inserted into the caulking through holes 14a for mounting, and fixed thereto by caulking performed from a side of chassis member 3 facing to the PDP 1. The X sustaining substrate 2X, the Y sustaining substrate 2Y and the signal processing substrate 2S are fixed to the boss members 14 by mounting screws or the like (not shown) through the through holes of the substrates. Therefore, the chassis member 3 and the electric circuit substrate 2 are joined. Further, as shown in the drawings, the other through holes 14a to be used for mounting another kind of the electric circuit substrate exist without the inserted boss members 14. In other words, some of the through holes 14a are not closed by the boss members 14 (are kept open).

The electric power source substrate 2P has through holes for mounting. The electric power source substrate 2P are connected t the chassis member through cut-and-raised portions 15. The cut-and-raised portions 15 are formed as follows. Firstly, a part of the chassis member 3 corresponding to the through holes of the electric power source substrate 2P are cut to form a cantilever shape. Next, the cut part is bent toward a mounting surface of the electric power source substrate 2P to extend perpendicularly to the chassis member, and subsequently a front end thereof is bent to extend parallel to the chassis member. In these operations, the cut-and-raised portions 15 are formed. The electric power source substrate 2P is fixed to the parallel extending part of the cut-and-raised portions 15 by mounting screws (not shown). Cut-and-raised through holes 15a are formed on the cut-and-raised portions 15 of the chassis member 3.

Next, adhesion between the PDP 1 and the chassis member 1 is explained. In this embodiment, the HM adhesive having adhesion at room temperature is used as a joint 8. The HM adhesive is heated to have a flow property of low viscosity (hereafter, called as melted condition), and is applied to a member (the PDP1) to be mounted. Heating temperature for melting is 120-180° C. The temperature higher than 180° C. causes an undesired deterioration in heat resisting property of a basic resin component of the HM adhesive. This deterioration proceeds in a hot dispenser (not shown) for applying the HM adhesive. Further, it becomes high in viscosity to decrease its flow property. Incidentally, compositions of the thermally conductive member 8 will be explained below.

FIGS. 2a and 2b show a condition of the joints applied to form the stripe shape on the back surface of the PDP 1 as the first embodiment. FIG. 2a is a front view showing the joints applied onto the back surface of the PDP 1 as seen from its side facing to the adhesive, and FIG. 2b is its cross sectional view taken along a horizontal direction.

In these drawings, the joints 8 is applied onto the buck surface of the PDP to form the stripe shape thereon. The joints 8 have rectangular shapes (hereafter, called as strip shapes) with a predetermined width WD, and are arranged along a direction of long side of the PDP 1 (the horizontal direction in the drawing) with a predetermined interval W. Further, longitudinal directions of the joints 8 are parallel to a direction of short side of the PDP 1 (the vertical direction of the drawing). As described above, the joints 8 of the embodiment are arranged along the direction of long side of the PDP 1 with the predetermined interval W.

In this embodiment, the joints 8 include first joints 8b separated from each other with the predetermined interval W as shown in FIGS. 2a and 2b, and second joints 8a arranged respectively at positions 14a' corresponding to the caulking through holes 14a opening on the chassis member 3 (the caulking through holes 14a in which the mounting boss 14 are not inserted) and positions 15a' corresponding to the cut- and raised through holes 15a. That is, in this embodiment, the caulking through holes 14a and cut- and raised through holes 15a opening on the chassis member 3 are closed by the second joints 8a or a combination of the first and second joints 8a and 8b. Therefore, the outside light proceeding from the through holes of the chassis member 3 is attenuated or blocked. The first joints 8b may have thermal conductivity as described above, and the second joints 8a may have the thermal conductivity or no thermal conductivity. For improving a cooling efficiency for the PDP 1, it is preferable for the second joints to have the thermal conductivity.

When the thermally conductive members 8 do not extend over the whole surface of PDP but arranged with the predetermined interval W as shown in FIGS. 2a and 2b, a temperature distribution on the PDP is uneven. The uneven temperature distribution causes an evenness in brightness on the screen image, that is, a brightness irregularity, because the thermal conductivity varies between a position on which the joints are applied and another position (air). Therefore, the inventors measures the brightness irregularity with changing the coating interval W and thickness of the joints 8 when displaying a wholly white image. In this situation, the width WD of the joint is about 10 mm, and a thickness of each of front glass panel and back glass panel of the PDP 1 is about 3 mm. The brightness irregularity is a ratio between a region of the highest brightness and a region of the lowest brightness when displaying, for example, the wholly white image. A critical point at which the brightness irregularity can be observed is experimentally about 2%, and if the brightness irregularity is not higher than this, it does not cause an actual problem.

When the thickness t is 1.0 mm and the interval W is not more than 5 mm, the brightness irregularity is not observed, and when the thickness t is 0.5 mm and the interval W is not more than 10 mm, the brightness irregularity is not observed. That is, under these situations, the brigness irregularity is not more than 2%. In other words, by decreasing the thickness t of the adhesive member 8, the coating interval W can be increased. For example, by decreasing the thickness t from 1 mm to 0.5 mm, the coating interval W can be changed from 5 mm to 10 mm. That is, when it is 0.5 mm, the coating interval W and the coating width WD may be substantially equal to each other so that an amount of the adhesive member 8 to be used may be a half of its amount to be used when the adhesive member 8 is applied to the whole surface. As a matter of course, when the thickness is 1 mm, the amount to be used may reduced by half to decrease the cost. Further, under the above situation, a temperature cycle test (repeating test between the room temperature and 100° C.) was performed as to whether nor not a removal of the adhesion occurs. It was confirmed that the removal of the adhesion does not occur in this situation.

Next, the compositions of the HM adhesive as the thermally conductive members 8 for the embodiment are explained. The HM adhesive is known as various kinds, but a typical one is explained here.

In the embodiment, as a base material of the HM adhesive, a base material (SEPS) including an elastic rubber component of a styrene-isoprene-styrene copolymer rubber (SIS) and hydrogen is used. For example, the copolymer rubber (SIS) is included by 30 wt %, and a hydrogenated resin is included by 40 wt %. Further, as an adhesion applicator, rosin ester is included by 10 wt %, and terpene resin is included by 10 wt %. Further, oil as softening agent for the flow property and a thermal degradation preventing agent are included respectively by 10 wt %. The HM adhesive of these components are used as a standard. Hereafter, the HM adhesive as the standard is called as HM adhesive A. Incidentally, a resin component of silicon type or acryl type solved by an organic solvent to be liquefied may be used as the adhesive. However, when this adhesive is used for coating, a process for desiccating the adhesive with, for example, 20 minutes/60° C. is needed during a normal process. This desiccating process causes an increase of the cost, and is not preferable.

As the copolymer rubber component, styrene-butadien-styrene (SBS) type, styrene-ethylene-butadien-styrene (SEBS) type which is made by adding hydrogen into the SBS type, or the like is usable. Further, a molecular weight of the copolymer rubber component affects a viscosity of melted condition, and is determined in accordance with a creep resistance and a temperature design of a device for applying the adhesive onto a member to be adhered.

The temperature/viscosity characteristic of the HM adhesive A of the above components are 170000 cps (170 Pa·s) at 120° C., and 60000 cps (60 Pa·s) at 140° C. These values were measured in a rotary viscosity meter.

FIG. 3 is a view showing a tensile shear strength with respect to the viscosity of the HM adhesive A. That drawing shows the tensile shear strength of the adhesive of thickness 40 µm between aluminum and aluminum. When the plasma display device is actually used, a temperature of the buck surface of PDP is not more than 60° C. in the room temperature (20° C.), so the tensile shear strength is measured in the atmosphere of temperature of 70° C. The viscosity of the HM adhesive for such condition is 170000 cps (170 Pa·s) at 120° C. Under such condition, as shown in FIG. 3, the tensile shear strength is about 15 N/cm$^2$ (1.5 Kg/cm$^2$). When the HM adhesive is applied to form the strip shape as shown in FIGS. 2a and 2b, an area on which the adhesion can be obtained is about a half (about 5000 cm$^2$) of an area of the back surface of the PDP, but a load of about 3.8 tons can be borne. Therefore, the HM adhesive of the embodiment can hold the PDP of 42 inches type having a weight of about 8 kg with a sufficient strength. The thicker the adhesive (that is, the thermally conductive member) is, the lower the tensile shear strength is, the strength by the adhesive having the thickness of about 1 mm is about one tenths of the strength by the adhesive having the thickness of about 40 µm, but the adhesive having the thickness of about 1 mm can hold the weight of about 380 kg. Therefore, the adhesive having the thickness of about 1 mm can hold the PDP of 42 inches type with a margin slightly lower than 50 (380/8=48).

For applying the thermal conductivity to the HM adhesive A, aluminum nitride may be included by the HM adhesive A with a rate of about 100 g of the aluminum nitride/1 kg of the HM adhesive A (hereafter, the HM adhesive to which the thermal conductivity is applied is called as HM adhesive AL). The thermal conductivity of the HM adhesive AL was about 0.4 W/mK, and an elongation after fracture $\epsilon$ is about 200% in the room temperature. Incidentally, when the aluminum nitride of 300 g is additionally included, the thermal conductivity of 1 W/mK is obtainable. Magnesium oxide, carbon graphite or the like may be included by about 50 weight % to obtain the thermal conductivity of about 1 W/mK.

The elongation after fracture $\epsilon$ of the joint 8 is represented by the following formula. The below formula 1 represents the elongation after fracture $\epsilon$ which can absorb a difference in thermal expansion coefficient between glass forming the back surface of PDP and aluminum as an example of the material of the chassis member.

$$\epsilon \geq (\tfrac{1}{2}) \times L \times (\lambda_2 - \lambda_1) \times \Delta T / t \quad \text{(formula 1)}$$

In the above formula 1, L is a length of the joint, $\lambda_2$ is a thermal expansion coefficient of aluminum as the material of the chassis member, $\lambda_1$ is a thermal expansion coefficient of glass, $\Delta T$ is a value of temperature increase, and t is a thickness of the thermally conductive member. Further, the thickness t of the thermally conductive member is obtained along the following formula 2 as a modification of the above formula 1.

$$t \geq (\tfrac{1}{2}) \times L \times (\lambda_2 - \lambda_1) \times \Delta T / \epsilon \quad \text{(formula 2)}$$

For example, when the PDP of 42 inches type is adhered to the chassis member, the thickness of the joint is determined as follows For example, the length L of the long side of PDP (the dimension in horizontal direction in screen) is 90 cm, the thermal expansion coefficient $\lambda_1$ of glass is 8.3×10−6/° C., the thermal expansion coefficient 2 of the aluminum chassis member is 22×10−6/° C., the value $\Delta T$ of temperature increase is 75° C. (the glass panel increases in temperature from the room temperature (25° C.) to 95° C. at maximum), and the elongation E after fracture is, for example 50%, the thickness t of the joint is 0.86 mm from the formula 2. That is, even when the thickness t of the joint is 0.43 mm, the difference in thermal expansion coefficient between the PDP (glass) and the chassis member (aluminum) can be absorbed.

As described above, when the elongation ε after fracture of the thermally conductive member is not less than 100%, the thickness of the joint can be decreased to not more than 1 mm. That is, when the elongation ε after fracture of the thermally conductive member is not less than 100%, the coating thickness of the HM adhesive AL can be decreased not more than 0.5 mm, so that an amount of the above mentioned HM adhesive to be used can be decreased for the decrease of the cost. Further, even when the thermal conductivity is about 0.4 W/mK, a thermal energy can be efficiently transmitted by the decreased thickness of the coating from the PDP to the chassis member so that a stress strain of the PDP can be decreased. Further, since the coating thickness can be decreased from, for example, 1 mm to not more than 0.5 mm, the thermal conductivity of the HM adhesive AL or the amount of the additional thermal conductivity applying agent included by the HM adhesive AL can be decreased. Bt decreasing the amount of the additional thermal conductivity applying agent, the viscosity of the HM adhesive AL is decreased to improve the flow property so that the coating efficiency is improved. By improving the coating efficiency, a time period of the coating process is decreased to decrease the cost.

Incidentally, the lower limit of the coating thickness t of the HM adhesive AL is 0.22 from the formula 2, because the elongation after fracture of the HM adhesive AL is about 20%. However, when the coating thickness of the HM adhesive AL is extremely small, the coating becomes difficult, so the coating thickness is preferably not less than 0.3 mm. Further, the upper limit of the coating thickness t of the HM adhesive AL is not more than 0.8 mm with taking the increase in difficulty of the coating in accordance with the increase of the coating thickness t into consideration. As a matter of course, the invention is not limited by these values.

Incidentally, by the addition of the thermal conductivity applying agent, a temperature-viscosity characteristic shifts toward a high viscosity side so that when the HM adhesive AL is applied with, for example, the hot dispenser, a discharged air pressure needs to be increased. Incidentally, the discharged air pressure is normally not more than 0.5 MPa (5 kg/cm$^2$).

Further, in the embodiment, the joint 8 includes one or a combination of carbon-black, alumina (aluminum oxide), silica, calcium carbonate, talc, ceramic, ceramic power, magnesium oxide, magnesium hydroxide, aluminum nitride, aluminum oxide, metallic power and so forth. Therefore, the joint 8 of the embodiment has a transmission coeficient not more than 20% for visible light area (wave length 400-700 nm), preferably not more than 6% (thickness of 1 mm for each case) to restrain the transmission of light. An amount of the filler for restraining the transmission of light as described above is, for example, not less than 2 volume % for carbon black only, or about not less than 30 volume % for alumina only. The alumina, the magnesium oxide, aluminum nitride, aluminum oxide, metallic powder or the like may be used as the thermal conductivity applying agent capable of restraining the transmission of light. Further, elastomer fine grains plated with Ni, Cu or the like of low electric resistance of thickness of 1-10 μm may be added to obtain the same effect in addition to the above filler. Diameter of the fine grains are about 50-1000 μm, and the added amount is preferably about 20-40 volume %.

The filler is included by the second joints 8a for closing the through holes 14a and 15a of the chassis member 2 as shown in FIGS. 2a and 2b. However, it may be added to the first joints 8b. Therefore, the transmission coeficient for visible light of the joints 8, particularly the second joints 8a is kept not more than 20%.

FIG. 4 is a view showing a result of measuring the transmission coeficient for visible light of the joints 8 of the embodiment including the alumina by 20 volume %. Incidentally, since the transmission coeficient varies in accordance with the thickness of the joints 8, the thickness is set at 1 mm in this case. In FIG. 4, a property 18 denoted by a dot line is a transmission coeficient of publicly used adhesive member (adhesive double coated tape of thickness 1 mm), and a property 19 denoted by a solid line is the transmission coeficient of the adhesive member of the embodiment. As shown in the drawing, the joints 8 of the embodiment has a good property for restraining the light transmission of not more than 10% for visible light area (wave length 400-700 nm).

Next, an adhering process between the PDP 1 and the chassis member 1 will be explained with making reference to FIG. 6. FIG. 6 is a flow chart showing an example of adhering process of the embodiment between the PDP 1 and the chassis member 1. In this drawing, at first step (hereafter, step is called as S), the whole of the back surface of the PDP 1 is coated with R-HM adhesive by the hot spray gun. Next, at step 2, the back surface of the PDP 1 is coated with the HM adhesive AL by the hot dispenser to form the strip shape of the predetermined interval as shown in FIGS. 2a and 2b. The hot dispenser not shown has a plurality of nozzles, and the nozzles are moved at a predetermined nozzle moving velocity with a distance of about 2 mm from the back surface of the PDP. By using the plurality of nozzles, the coating can be performed all at once to decrease the process time period so that the cost is decreased. Next, the chassis member 3 is mounted on the PDP with the coated HM adhesive AL thereon while aligning them with respect to each other (S3). Subsequently, the chassis member 3 is heated to increase the temperature of the pressed surface of the chassis member 3 to preferably 60-80° C. and being pressed during a predetermined time period to be adhered (S4). At this time, the adhering process is completed. Since a time period in which the HM adhesive becomes like rubber is short (for example, some seconds), a time period of the coating-adhering process can be decreased to decrease the cost. Incidentally, the PDP 1 is adhered to the chassis member 3 after the PDP 1 is coated with the HM adhesive AL in FIG. 6, however, the invention does not need to be limited thereto. For example, the PDP 1 is adhered to the chassis member 3 after the chassis member 3 is coated with the HM adhesive AL.

Next, an adhering process between the PDP 1 and the chassis member 1 will be explained. FIG. 5 is a flow chart showing the adhering process. In this drawing, at first step (hereafter, step is called as S), the back surface of the PDP 1 is coated with HM adhesive AL as the first joint 8b to form the strip shape of the predetermined interval as shown in FIGS. 2a and 2b. The HM adhesive AL is applied by the hot dispenser. The hot dispenser not shown has a plurality of nozzles, and the nozzles are moved at a predetermined nozzle moving velocity with a distance of about 2 mm from the back surface of the PDP. In this embodiment, the width WD of the strip shape is 10 mm, the coating interval W is 10 mm, and the coating thickness t is 0.5 mm. By using the plurality of nozzles, the coating can be performed all at once to decrease the process time period so that the cost is decreased. Next, at step 2, the HM adhesive member as the second joints 8a is applied to the positions 14a' corresponding to the caulking through holes 14a and the positions 15a' corresponding to the cut-and-raised through holes 15a by the nozzles used in the step 1 or the other nozzles. Subsequently, at step 3, the chassis member 3 is mounted on the PDP having the coated HM adhesive AL thereon while aligning them with respect to each other. Finally, at step 4, the chassis member 3 is heated to increase the temperature of the pressed surface of the chassis member 3 to 60-80° C. and being pressed during a predetermined time period to be adhered. At this time, the adhering process is completed.

Since a time period in which the HM adhesive becomes like rubber is short (for example, some seconds), a time period of the coating-adhering process can be decreased to decrease the cost. Incidentally, the PDP 1 is adhered to the chassis member 3 after the PDP 1 is coated with the HM adhesive AL in FIG. 5, however, the invention does not need to be limited thereto. For example, the PDP 1 may be adhered to the chassis member 3 after the chassis member 3 is coated with the HM adhesive AL.

FIG. 6 is a cross sectional view of the plasma display device as the first embodiment of the invention. In this embodiment, the rear cover 7 including outside air inlet holes 7*a* and air discharge holes 7*b* covers the back surfaces of the chassis member 3 and the PDP 1. A stand 17 supports the plasma display device at an lower portion thereof. The electric circuit substrates 2 are fixed to the chassis member through the mounting bosses 14 with the mounting screws 16. In this embodiment, a fan not shown takes the air (outside air) through the outside air inlet holes 7*a* into the device to cool the chassis member 3 and the electric circuit substrates 2. The air is discharged through the air discharge holes 7*b* from the device. With taking convection current into consideration, normally, the outside air inlet holes 7*a* are arranged at the lower portion of the apparatus, and the air discharge holes 7*b* are arranged at an upper portion of the apparatus. As a matter of course, such arrangement may be reversed.

As shown in FIG. 6, there is a probability of that the outside light proceeds into the plasma display device through the outside air inlet holes 7*a* and air discharge holes 7*b*. The outside light may includes a light for illuminating a room in which the plasma display device is arranged, a part of the light reflected by a wall facing to a back surface of the device, a light emitted by a lighting equipment arranged to face to the back surface of the device as an interior or the like. The light taken into the device through the outside air inlet holes 7*a* and air discharge holes 7*b* proceeds through the caulking through holes 14*a* and the cut-and-raised through holes 15*a* (arrow marks A, B in the drawing). However, the second joints 8*a* are arranged at the positions of the back surface of the PDP 1 corresponding to the caulking through holes 14*a* and the cut-and-raised through holes 15*a*. Since the second joints 8*a* have light blocking effect as described above, the outside light is significantly restrained from reaching the back surface of the PDP 1. Therefore, an undesirably brightened portion caused by the outside light, that is, the brightness irregularity is restrained or prevented from occurring.

As described above, in the embodiment, the second joints 8*a* arranged to correspond to the through holes 14*a* and 15*a* have the light blocking effect. On the other hand, the first joints may have the light blocking effect, and only one(s) of the first joints combined with one(s) of the second joints to close the through hole(s) may have the light blocking effect.

Embodiment 2

In the first embodiment, the joints 8 of strip shape having the width WD are arranged along the direction of the long side of PDP (screen horizontal direction) with the predetermined interval. However, the invention should not be restricted thereto. For example, as a second embodiment shown in FIGS. 7*a* and 7*b*, the width WD and interval W of the joints 8 may be changed in accordance with their position in the direction of the long side of PDP.

FIG. 7*a* is a view showing the back surface of the PDP as the second embodiment. As shown in 7*a*, the width and interval of the joints 8 are changed in accordance with their position in the direction of the long side of PDP. Particularly, ones of the joints 8 at the positions 14' and 15*a*' corresponding to the through holes 14*a* and 15*a* are made wider that the other ones of the joints 8 at the other positions. Further, the distance between the ones of the joints 8 at the positions is narrower that the distance between the other ones of the joints 8 at the other positions. Therefore, the positions 14*a*' and 15*a*' can be covered one of the joints 8. As a result thereof, the second joints 8*a* become unnecessary so that the joints 8 in the first embodiment can be formed in single process. Therefore, the step 2 in FIG. 3 can be deleted to decrease the cost.

Incidentally, also in this embodiment, the through holes 14*a* and 15*a* are closed by the joints 8 at least optically. Since the joints have the light blocking effect similarly to the first embodiment, the outside light proceeding into the device is prevented from reaching the back surface of the PDP 1. Therefore, the undesirably brightened portion caused by the outside light, that is, the brightness irregularity is restrained or prevented from occurring.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A flat panel display comprising,
   a display panel, a metallic chassis, and a plurality of joints through which a back surface of the display panel and the chassis are connected to each other,
   wherein the joints are arranged on the back surface of the display panel distant from each other in a predetermined direction, the chassis includes an open through hole,
   at least one of the joints is arranged at a position corresponding to the open through hole, and
   a transmission coefficient of the at least one of the joints for visible light is not more than 20%.

2. The flat panel display according to claim 1, wherein all the joints have thermal conductivity.

3. The flat panel display according to claim 1, wherein the joints have rectangular shapes.

4. The flat panel display according to claim 2, wherein the joints are arranged in a long side direction of a screen of the display panel with a predetermined interval, and extends in a short side direction of the screen of the display panel.

5. The flat panel display according to claim 1, wherein transmission coefficients of all of the joints for visible light are not more than 20%.

6. The flat panel display according to claim 1, further comprising an electric circuit substrate, wherein the open through hole of the chassis is capable of receiving a boss member for connecting the chassis and the electric circuit substrate to each other.

7. The flat panel display according to claim 1, further comprising an electric circuit substrate, wherein the open through hole of the chassis is arranged to form a boss member connecting the chassis and the electric circuit substrate to each other.

8. The flat panel display according to claim 1, wherein the display panel is a plasma display panel.

9. A flat panel display comprising,
a display panel, a metallic chassis and a plurality of thermally conductive joints through which a back surface of the display panel and the chassis are connected to each other,
wherein the joints are adhesive of hot-melt type having adhesion at normal temperatures, and are arranged distant from each other in a predetermined direction, the chassis includes an open through hole,
at least one of the joints closes the through hole of the chassis, and
a transmission coefficient of the at least one of the joints for visible light is not more than 20%.

10. The flat panel display according to claim 9, wherein the one of the joints is greater in area than the other one of the joints.

11. The flat panel display according to claim 9, further comprising a rear cover covering the back surface of the chassis and including a vent hole,
wherein transmission coefficients of the joints for visible light are not more than 20% so that an outside light proceeding toward the back surface of the display panel through the vent hole of the rear cover and the open through hole of the chassis is attenuated or blocked.

12. A flat panel display comprising, a display panel having a front surface including a screen and a back surface opposite to the front surface in a thickness direction of the display panel, a chassis extending to face to the back surface in the thickness direction and including an open through hole extending in the thickness direction,
wherein the flat panel display further comprises an adhesive adhering to at least one of the back surface and the chassis and extending so that the adhesive and the open through hole overlap each other as seen in the thickness direction, and
a transmission coefficient of the adhesive for visible light is not more than 20%.

13. The flat panel display according to claim 12, wherein the adhesive extends so that the adhesive and the whole of the open through hole overlap each other as seen in the thickness direction.

14. The flat panel display according to claim 12, wherein the adhesive further extends to surround the open through hole as seen in the thickness direction.

15. The flat panel display according to claim 12, wherein the adhesive is arranged between the back surface and the chassis.

16. The flat panel display according to claim 1, further comprising a rear cover covering the back surface and including a vent hole, wherein the at least one of the joints is arranged to interrupt a light proceeding toward the back surface through the vent hole and the open through hole.

17. The flat panel display according to claim 9, further comprising a rear cover covering the back surface and including a vent hole, wherein the at least one of the joints is arranged to interrupt a light proceeding toward the back surface through the vent hole and the open through hole.

* * * * *